April 21, 1970 R. L. JAMES 3,508,253

RESET NETWORK FOR DIGITAL COUNTER

Filed Nov. 4, 1966 2 Sheets-Sheet 1

INVENTOR.
ROBERT L. JAMES
BY
Anthony J. Cuoco
AGENT

April 21, 1970 R. L. JAMES 3,508,253

RESET NETWORK FOR DIGITAL COUNTER

Filed Nov. 4, 1966 2 Sheets-Sheet 2

INVENTOR.
ROBERT L. JAMES
BY [signature]
AGENT

United States Patent Office 3,508,253
Patented Apr. 21, 1970

3,508,253

RESET NETWORK FOR DIGITAL COUNTER

Robert L. James, Bloomfield, N.J., assignor to The Bendix Corporation, a corporation of Delaware Filed Nov. 4, 1966, Ser. No. 592,045
Int. Cl. H03k 13/02
U.S. Cl. 340—347 5 Claims

ABSTRACT OF THE DISCLOSURE

A reset network for a counter of the type which provides a plurality of digital outputs. The reset network provides a pulse for controlling the counter so that the counter provides a predetermined digital output used as a reference for subsequent counting sequences.

BACKGROUND OF THE INVENTION

In a system such as that disclosed and claimed in copending U.S. application Ser. No. 558,327, filed June 17, 1966, by Robert L. James, and assigned to The Bendix Corporation, assignee of the present invention, there is included a binary counter having a plurality of stages each of which has two stable states. Each stable state provides a digital output at a predetermined logic level, which output corresponds to a binary bit of a digital number, and simultaneously provides another output at a complementary logic level. By way of example, when a stage of the plurality of stages of the binary counter is in one of its stable states, the digital output therefrom may be at a logic "one" level and the complementary output may be at a logic "zero" level. When the stage of the counter is in its other stable state, the digital output is at a logic "zero" level and the complementary output is at a logic "one" level. A counter of the type described is disclosed and claimed in copending U.S. application Ser. No. 603,631, filed Dec. 21, 1966, by Robert L. James and assigned to The Bendix Corporation, assignee of the present invention. It is to be further noted that each stage of the counter drives the next succeeding stage thereof.

In the system disclosed and claimed in the aforenoted U.S. application Ser. No. 558,327, digital outputs from each of the stages of the counter are applied to a digital to analog converter which converts the digital outputs into a corresponding analog output. In order for the analog output to be at the same reference level each time the system starts operating, i.e., at the start of each counting sequence, it is necessary to reset the counter Heretofore, this has been accomplished by using electromechanical devices such as relays which are space consuming and have relatively low reliability. The novel arrangement of the present invention utilizes solid state components having the advantages of no moving parts, reduced weight and volume and increased reliability. With this arrangement, pulses of a predetermined duration are provided for resetting the counter to a combination of digital outputs, which digital outputs affect the digital to analog converer so that the analog output provided thereby is at the predetermined reference level at the start of each counting sequence.

One object of this invention is to provide means having reduced weight and volume, increased reliability and no moving parts for controlling a digital counter of the type described.

Another object of this invention is to provide pulses of a predetermined duration for resetting the counter at the start of each counting sequence.

Another object of this invention is to reset the counter to a predetermined combination of digital outputs so that the corresponding analog output is at a predetermined reference level.

These and other objecs and features of the invention are pointed out in the following descrpition in terms of the embodiment thereof which is shown in the accompanying drawings. It is to be understood, however, that the drawings are for the purpose of illustration only and are not definition of the limits of the invention, reference being had to the appended claims for this purpose.

This invention contemplates, in a system including a binary counter of the type which provides a plurality of digital outputs and a digital to analog converter responsive to the digital outputs for providing an analog output, a control network for the counter which comprises: first means operative for providing an output signal; second means connected to the first means and responsive to the signal therefrom for providing a pulse of a predetermined duration; and the counter being connected to the second means and responsive to the pulse therefrom for providing a combination of digital outputs so that the analog output provided by the digital to analog converter is at a predetermined reference level.

Figure 1:
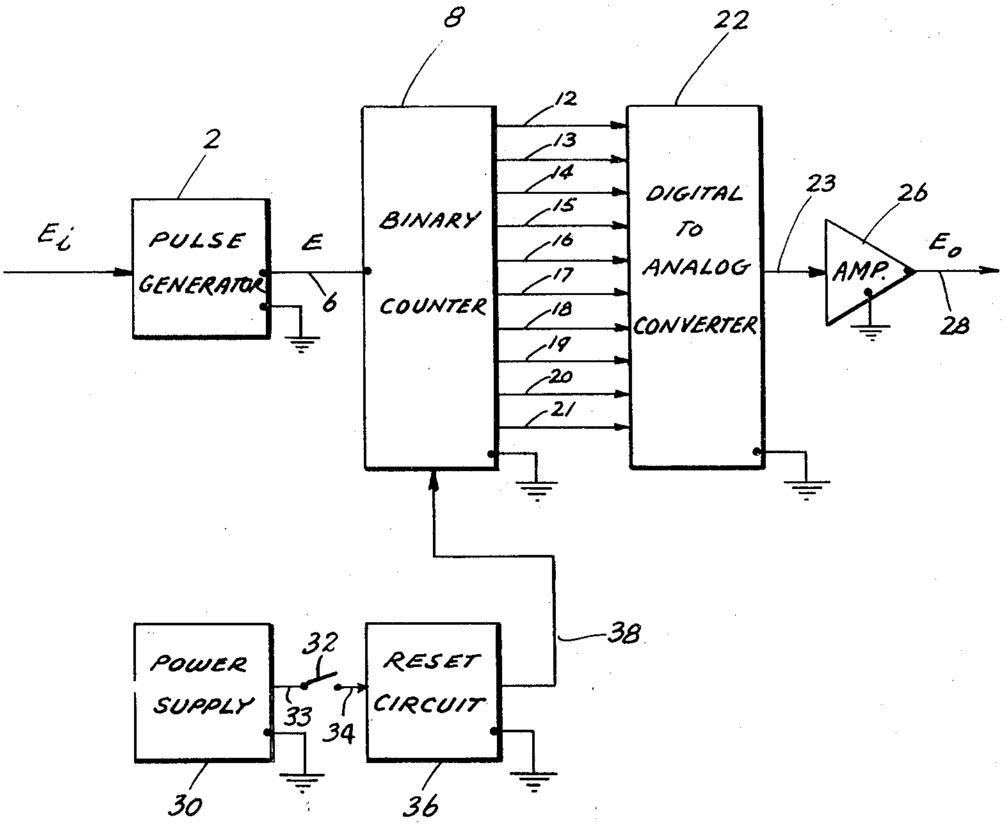
FIGURE 1 is a block diagram showing a system including a binary counter, a digital analog converter and a control network in accordance with the present invention.

With reference to FIGURE 1, a pulse generator 2 provides at an output conductor 6 a pulse E having a frequency corresponding to the amplitude of a direct current input signal $E_1$. The pulse E is applied to a binary counter 8 which is of the type disclosed and claimed in the aforenoted copending U.S. appliaction Ser. No. 603,-631. As heretofore noted, the counter 8 has a plurality of stages each having two stable states, with each preceding stage driving the next succeding stage.

Leading from each of the stages of counter 8 is an output conductor, with said output conductors being designated by the numerals 12 to 21 and carrying digital outputs corresponding to binary bits of the total number of the pulses E provided by pulse generator 2. The digital outputs at the output conductors 12 to 21 are applied through the conductors 12 to 21 to a digital to analog converter 22 and the output therefrom at an output conductor 23 is applied through the output conductor 23 to an amplifier 26 having an output conductor 28 at which is provided an analog output $E_0$ corresponding to the total number of the pulses E from the pulse generator 2.

In a system such as that disclosed in the aforenoted copending U.S. application Ser. No. 558,327 it is necessary that the analog output $E_0$ be at the same reference level each time the system starts operating. When the system is started a switch 32 may be manually or automatically closed to connect a direct current power supply designated by the numeral 30 for example. The output of the power supply 30 at an output conductor 34 is applied through the output conductor 34 to a reset circuit 36. At the instant the power supply 30 is connected, the reset circuit 36 provides at an output conductor 38 a pulse of a predetermined duration. The pulse is applied through the output conductor 38 to the binary counter 8 to reset the binary counter 8 so that a predetermined combination of digital outputs is provided at the output conductors 12 to 21 of the binary counter 8, whereby the analog output $E_0$ provided at the output conductor 28 of the amplifier 26 is at a predetermined reference level.

Figure 2:
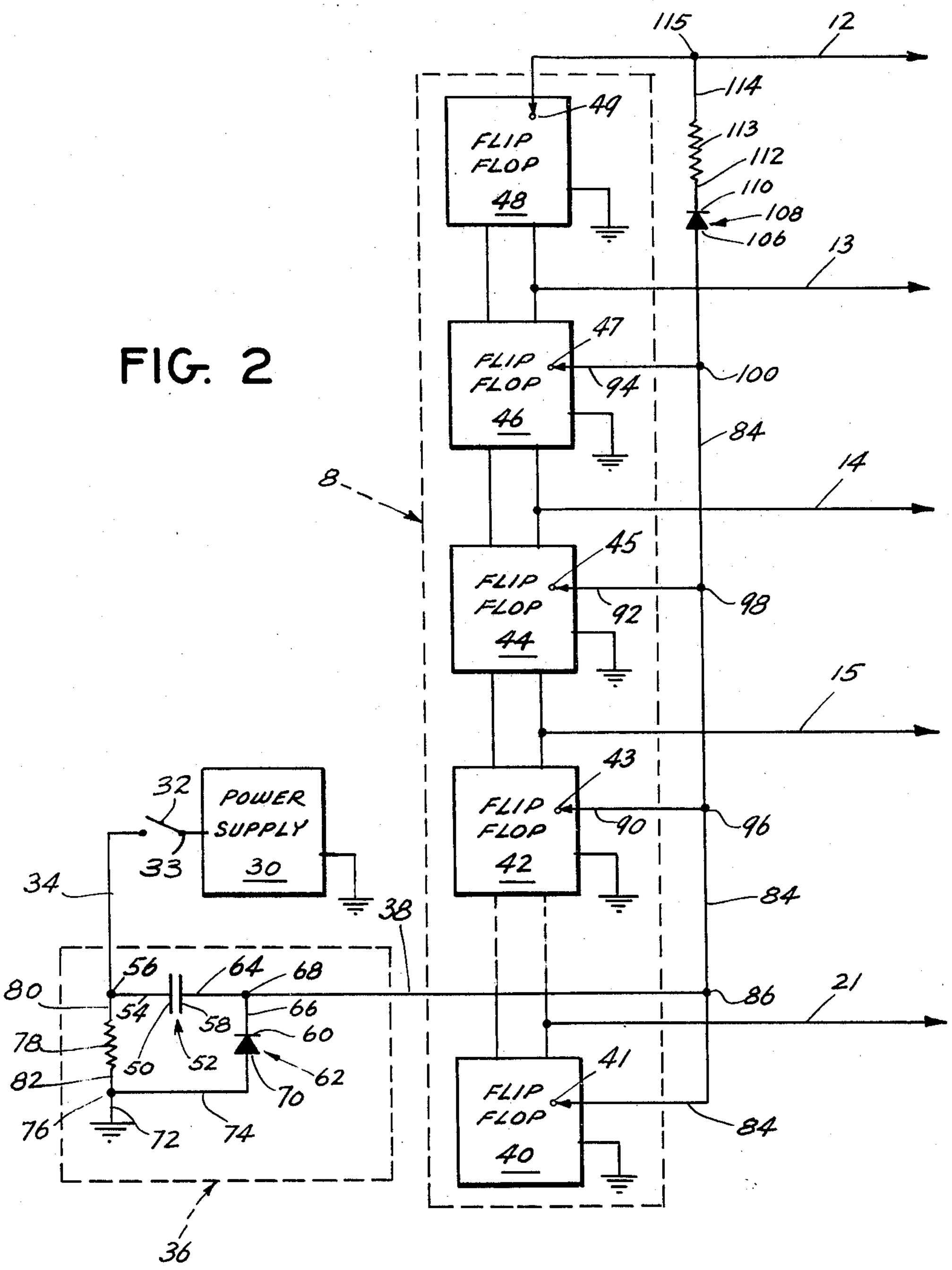
FIGURE 2 is a schematic diagram showing the binary counter and the control network shown generally in the block diagram of FIGURE 1.

With reference to FIGURE 2 each stage of the binary counter 8 is represented by a flip flop such as the flip flops 40, 42, 44, 46 and 48, with each flip flop driving the next succeeding flip flop as heretofore noted. Flip flop 48 represents the most significant stage and flip flop 40 represents the least significant stage of counter 8. The flip flops 40, 42, 44, 46 and 48 provide digital outputs at the output conductors 21, 15, 14, 13 and 12, respectively.

The switch 32 is connected to the power supply 30 through a conductor 33, with the power supply 30 providing a direct current output at the conductor 34 thereof upon closure of the switch 30. The direct current output at the output conductor 34 is applied through the output conductor 34 to a capacitor 52 in the reset circuit 36 through a conductor 54 joining the output conductor 34 at a point 56 and leading to a plate 50 of the capacitor 52. The capacitor 52 has a plate 58 connected to a cathode 60 of a diode 62 through a conductor 64 leading from the plate 58 and joining a conductor 66 leading to the cathode 60 at a point 68. The diode 62 has an anode 70 connected to a grounded conductor 72 through a conductor 74 leading from the anode 70 and joining the grounded conductor 72 at a point 76. A resistor 78 is connected to the pltae 50 of the capacitor 52 and to the anode 70 of the diode 62 through a conductor 80 joining the conductor 54 leading to the plate 50 at the point 56 and a conductor 82 joining the conductor 74 leading from the anode 70 at the point 76.

The output of the reset circuit 36 is applied at the ouput conductor 38, which output conductor 38 joins at the point 68 the conductor 64 leading from the plate 58 of the capacitor 52 and the conductor 66 leading to the cathode 60 of the diode 62. This output is applied to a reset terminal 41 of the flip flop 40 through the output conductor 38 and a conductor 84. The conductor 38 joins the conductor 84 at a point 86 and the conductor 84 has one end thereof connected to the reset terminal 41 of the flip flop 40. The output at the output conductor 38 is applied through the conductor 84 to the flip flops 42, 44 and 46 through a conductor 90, a conductor 92 and a conductor 94 joining the conductor 84 at points 96, 98 and 100, respectively.

The conductor 90 leads to a reset terminal 43 of the flip flop 42, the conductor 92 leads to a reset terminal 45 of the flip flop 44 and the conductor 94 leads to a reset terminal 47 of the flip flop 46. The other end of the conductor 84 is connected to an anode 106 of a diode 108 having a cathode 110 connected through a conductor 112, a resistor 113 and a conductor 114 at a point 115 to the conductor 12 leading from an output terminal 49 of the flip flop 48.

OPERATION

When switch 32 is operated to connect power supply 30, a direct current output is provided at the conductor 34 which charges the capacitor 52 to the level of the direct current output from power supply 30. During the time that the capacitor 52 is being thus charged, an output appears across the output conductor 38 and ground which decays from the level of the output from power supply 30 to zero, thereby providing at the output conductor 38 a pulse of a predetermined duration.

This pulse is applied to the reset terminals 41, 43, 45 and 47 of the stages of the counter 8 represented by the flip flops 40, 42, 44 and 46, respectively, for setting these stages to the same output state, for example, logic "one" and is applied to the output terminal 49 of the most significant stage of the counter 8 represented by the flip flop 48 to set this stage to the opposite output state, for example, logic "zero". Binary counter 8 thus provides at the output conductors 21, 15, 14, 13 and 12 a combination of digital outputs for effecting the digital to analog converter 22 so that the analog output $E_o$ provided at the output conductor 28 of the amplifier 26 is at a predetermined reference level which may, by way of example, be zero.

Capacitor 52 and resistor 78 are preselected so that the decay interval for the output across the output conductor 38 of the reset circuit 62 and ground is sufficient to insure resetting of each of the stages of the counter 8. The diode 62 protects the binary counter 8 from reverse polarity input transients occurring when switch 32 is operated to disconnect power supply 30. Capacitor 52 discharges through the diode 62 and the resistor 78 when power supply 30 is disconnected in preparation for resetting the binary counter 8 upon the power supply 30 being once again connected by closure of the switch 32 to start another counting sequence.

The most significant stage of counter 8 represented by the flip flop 48 is reset by applying the reset pulse to the output terminal 49 thereof. This is a significant feature of the present invention since it permits resetting of the most significant stage through the use of an existing terminal, thereby simplifying the resetting circuitry. It is to be noted in this connection that the other stages of the binary counter 8 represented by the flip flops 40, 42, 44 and 46 are reset by applying the reset pulse to the reset terminals 41, 43, 45 and 47, respectively, since this arrangement permits resetting with a relatively lower current drain.

The diode 108, through which the reset pulse is applied to the output terminal 49 of the flip flop 48, isolates the output terminal 49 from the reset terminals 41, 43, 45 and 47 of the flip flops 40, 42, 44 and 46, respectively, thereby preventing erroneous resetting of the flip flops 40, 42, 44, and 46 which might otherwise be occasioned by changes of state of the most significant flip flop 48.

The novel arrangement of the present invention provides means having reduced weight and volume, simplified circuitry and increased reliability for resetting a digital counter. The arrangement is particularly adaptable to the use of solid state components and thus permits circuit structure which would have been otherwise prohibited because of the complexity arising from the use of conventional components.

Although only one embodiment of the invention has been illustrated and described, various changes in the form and relative arrangements of the parts, which will now appear to those skilled in the art may be made without departing from the scope of the invention. Reference is, therefore, to be had to the appended claims for a definition of the limits of the invention.

What is claimed is:

1. In a system including a counter having a plurality of stages varying in significance for providing a plurality of digital outputs and a digital to analog converter responsive to the digital outputs for providing an analog output, a reset network for the counter which comprises:
first means operative for providing an output signal;
second means connected to the first means and responsive to the output signal provided thereby for providing a reset pulse during a predetermined interval;
the stages of the counter being connected to the second means and responsive to the reset pulse provided thereby for providing a predetermined combination of digital outputs so that the analog output provided by the digital to analog converter is at a predetermined reference level; and
third means for coupling the second means to the most significant stage of the counter so as to permit current flow in one sense, and to inhibit current flow in the opposite sense to electrically isolate the most significant counter stage from the other stages to prevent transient currents in the opposite sense from affecting said most significant stage.

2. A reset network as described by claim 1, wherein:
the most significant stage of the counter is responsive to the pulse from the second means so as to provide a digital output which is at one predetermined logic level; and
the other stages of the counter are responsive to the pulse from the second means so as to provide digital outputs all of which are at another predetermined output level.

3. A reset network as described by claim 1 wherein the third means includes:

a unidirectional current flow control device having electrodes between which a current flows and input and output current flow control elements; and the input current flow control element being connected to the second means and the output current flow control element being connected to the most significant stage of the counter so as to permit a predetermined current flow between the second means and the most significant stage of the counter.

4. A reset network as described by claim 1, wherein the second means includes:

a capacitor connected to the first means so as to be charged by the output therefrom during the predetermined interval; and circuit means connected to the capacitor and connected to the first means for providing the reset pulse, said pulse decaying from the level of the output from the first means to zero during the predetemined interval.

5. A reset network as described by claim 4 wherein the circuit means includes:

means through which the capacitor discharges when the system is operated to stop one counting sequence so as to render the second means effective to provide the reset pulse when the system is operated to start another counting sequence.

References Cited

UNITED STATES PATENTS

| | | | |
|---|---|---|---|
| 2,976,487 | 3/1961 | Cohen. | |
| 3,064,889 | 11/1962 | Hupp | 340—347 |
| 3,080,555 | 3/1963 | Vadus et al. | 235—92 |
| 3,241,063 | 3/1966 | Beattie et al. | |
| 3,272,994 | 9/1966 | Brown | 328—48 |
| 3,298,019 | 1/1967 | Nossen | 235—92 |
| 3,300,724 | 1/1967 | Cutaia | 328—48 |
| 3,329,903 | 7/1967 | Cork et al. | 328—48 |
| 3,413,449 | 11/1968 | Brown | 235—92 |

MAYNARD R. WILBUR, Primary Examiner

J. GLASSMAN, Assistant Examiner

U.S. Cl. X.R.

235—92; 328—48